US012787673B2

(12) United States Patent
Lee et al.

(10) Patent No.: US 12,787,673 B2
(45) Date of Patent: Nov. 3, 2026

(54) METHOD OF FORMING SEMICONDUCTOR DEVICE AND SUBSTRATE PROCESSING SYSTEM FOR FORMING SEMICONDUCTOR DEVICE

(71) Applicant: SEMES CO., LTD., Cheonan-si (KR)

(72) Inventors: Hanglim Lee, Cheonan-si (KR); Minyoung Kim, Hwaseong-si (KR); Thomas Jongwan Kwon, Seongnam-si (KR)

(73) Assignee: SEMES CO., LTD., Cheonan-si (KR)

(*) Notice: Subject to any disclaimer, the term of this patent is extended or adjusted under 35 U.S.C. 154(b) by 404 days.

(21) Appl. No.: 18/243,255

(22) Filed: Sep. 7, 2023

(65) Prior Publication Data

US 2024/0105456 A1 Mar. 28, 2024

(30) Foreign Application Priority Data

Sep. 26, 2022 (KR) ........................ 10-2022-0121621

(51) Int. Cl.
*H10P 50/64* (2026.01)
*C23C 16/02* (2006.01)
(Continued)

(52) U.S. Cl.
CPC ........ *H10P 50/642* (2026.01); *C23C 16/0227* (2013.01); *H10W 20/081* (2026.01); *H10W 20/427* (2026.01)

(58) Field of Classification Search
CPC ........ H10P 50/642; H10P 70/20; H10P 50/61; H10P 50/613; H10P 70/56;
(Continued)

(56) References Cited

U.S. PATENT DOCUMENTS 6,630,024 B2 10/2003 Schmolke et al.
7,344,983 B2 3/2008 Deshpande et al.
(Continued)

FOREIGN PATENT DOCUMENTS

EP 1160360 A1 12/2001
KR 1020090052331 A 5/2009
(Continued)

OTHER PUBLICATIONS

Office Action dated Jun. 23, 2024, for the corresponding Korean Patent Application No. 10-2022-0121621.

*Primary Examiner* — Yara B Green
*Assistant Examiner* — Benjamin Michael Kupp
(74) *Attorney, Agent, or Firm* — Muir Patent Law, PLLC

(57) ABSTRACT

A method of forming a semiconductor device includes pretreating a semiconductor substrate including at least one buried power rail for power transmission, based on chemical reaction by supplying a pretreatment gas for surface treatment onto a backside of the semiconductor substrate, forming at least one metal catalyst layer on the backside of the semiconductor substrate so as to be at least partially aligned with the at least one buried power rail, and forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using metal assisted chemical etching (MACE).

18 Claims, 10 Drawing Sheets

(51) Int. Cl.
*H10W 20/00* (2026.01)
*H10W 20/41* (2026.01)

(58) Field of Classification Search
CPC ............. H10P 72/0422; H10P 72/0468; C23C 16/0227; H10W 20/081; H10W 20/427; H10W 20/069; H10W 20/023; H10W 20/021
See application file for complete search history.

(56) References Cited

U.S. PATENT DOCUMENTS

| | | | | |
|---|---|---|---|---|
| 8,404,590 | B2 | 3/2013 | Lee et al. | |
| 8,808,563 | B2 | 8/2014 | Wang et al. | |
| 9,076,651 | B1 * | 7/2015 | Ahmed ............... | H10P 14/6504 |
| 9,293,352 | B2 | 3/2016 | Hashizume et al. | |
| 9,847,222 | B2 * | 12/2017 | Reilly ................. | H10P 14/6334 |
| 9,911,878 | B2 * | 3/2018 | Yim ........................ | H10F 77/70 |
| 10,134,634 | B2 * | 11/2018 | Li ........................ | H10W 20/023 |
| 10,811,315 | B2 * | 10/2020 | Hiblot ................. | H10W 20/023 |
| 10,872,818 | B2 | 12/2020 | Chiang et al. | |
| 2005/0217569 | A1 * | 10/2005 | Ramaswamy ...... | H10P 72/0602 117/105 |
| 2014/0322446 | A1 | 10/2014 | Dordi et al. | |
| 2019/0378724 | A1 | 12/2019 | Toda et al. | |
| 2022/0020666 | A1 * | 1/2022 | Van Dal ............. | H10D 84/0158 |
| 2022/0123015 | A1 | 4/2022 | Na et al. | |
| 2022/0139717 | A1 | 5/2022 | Sreenivasan et al. | |
| 2022/0375751 | A1 * | 11/2022 | Huang ................ | H10P 14/3602 |

FOREIGN PATENT DOCUMENTS

| | | | |
|---|---|---|---|
| KR | 1020120010980 | A | 2/2012 |
| KR | 1020130024774 | A | 3/2013 |
| KR | 1020140082781 | A | 7/2014 |
| KR | 1020190139770 | A | 12/2019 |
| KR | 1020200049468 | A | 5/2020 |
| KR | 1020210142118 | A | 11/2021 |
| KR | 20220051549 | A | 4/2022 |

* cited by examiner

METHOD OF FORMING SEMICONDUCTOR DEVICE AND SUBSTRATE PROCESSING SYSTEM FOR FORMING SEMICONDUCTOR DEVICE

CROSS-REFERENCE TO RELATED PATENT APPLICATION

This application claims the benefit of Korean Patent Application No. 10-2022-0121621, filed on Sep. 26, 2022, in the Korean Intellectual Property Office, the disclosure of which is incorporated herein in its entirety by reference.

BACKGROUND OF THE INVENTION

1. Field of the Invention

The present invention relates to semiconductor manufacturing and, more particularly, to a method of forming a semiconductor device and a substrate processing system for forming the semiconductor device.

2. Description of the Related Art

Due to high integration of semiconductor devices, not only the semiconductor devices but also wiring structures have become complicated. Thus, resistance through power transmission wires of the semiconductor devices is increased and a voltage drop through the wires during power transmission is regarded as a critical issue. As such, a low-resistance power grid design is required for highly-integrated semiconductor devices.

For example, a structure in which a semiconductor substrate is provided with buried power rails and via electrodes for power transmission are connected to the buried power rail is being developed. In general, the via electrodes, e.g., through substrate vias (TSVs), are formed using laser drilling or plasma etching.

However, the above-mentioned methods may increase a process cost and, specifically, plasma etching may cause ion damage by plasma in the substrate. As such, a method capable of lowering a process cost and reducing substrate damage is required.

SUMMARY OF THE INVENTION

The present invention provides a method of forming a semiconductor device, the method being capable of lowering a process cost and reducing substrate damage, and a substrate processing system for forming the semiconductor device. However, the above description is an example, and the scope of the present invention is not limited thereto.

According to an aspect of the present invention, there is provided a method of forming a semiconductor device, the method including pretreating a semiconductor substrate including at least one buried power rail for power transmission, based on chemical reaction by supplying a pretreatment gas for surface treatment onto a backside of the semiconductor substrate, forming at least one metal catalyst layer on the backside of the semiconductor substrate so as to be at least partially aligned with the at least one buried power rail, and forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using metal assisted chemical etching (MACE).

The pretreatment gas may include carbonyl sulfide (COS) gas for removing a natural oxide layer on the backside of the semiconductor substrate, and the pretreating may use non-plasma thermal activation to prevent plasma damage to the semiconductor substrate.

The pretreatment gas may include radicals activated in a remote plasma generator to remove a natural oxide layer on the backside of the semiconductor substrate.

The pretreating may include removing a natural oxide layer on the backside of the semiconductor substrate, and modifying the backside of the semiconductor substrate to have hydrophilic termination.

The removing of the natural oxide layer may be performed by providing COS gas onto the backside of the semiconductor substrate, and the modifying of the backside of the semiconductor substrate may be performed by supplying hydrogen gas onto the backside of the semiconductor substrate.

The pretreating and the forming of the at least one metal catalyst layer may be performed in situ in one process chamber or different process chambers of one metal deposition module while maintaining a vacuum atmosphere.

At least a top surface and side walls of the at least one buried power rail may be surrounded by a liner insulating layer when viewed from the backside of the semiconductor substrate and, in the forming of the at least one backside via hole, the etching of the semiconductor substrate may be stopped when the at least one metal catalyst layer is at least partially in contact with the liner insulating layer.

A diameter or a width of the at least one metal catalyst layer may be less than or equal to a width of the at least one buried power rail, and the at least one metal catalyst layer may be vertically aligned with and spaced apart from the at least one buried power rail or vertically spaced apart from the at least one buried power rail within the width of the at least one buried power rail when viewed from a cross-section of the semiconductor substrate.

The method may further include forming, on the backside of the semiconductor substrate, a passivation insulating layer having an opening at least partially aligned with the at least one buried power rail, and the at least one metal catalyst layer may be formed in the opening of the passivation insulating layer.

The forming of the passivation insulating layer may include forming a photoresist layer on the passivation insulating layer to expose the opening, and forming the opening by etching the passivation insulating layer by using the photoresist layer as an etch mask, and the forming of the at least one metal catalyst layer may include forming a metal catalyst layer on the passivation insulating layer on which the photoresist layer remains, and forming the at least one metal catalyst layer remaining in the opening, by removing a portion of the metal catalyst layer on the photoresist layer by using a lift-off method.

The method may further include removing the at least one metal catalyst layer descended to a bottom surface of the at least one backside via hole, forming a liner dielectric layer on at least a side wall of the at least one backside via hole, and forming a buried conductive layer to bury the at least one backside via hole.

The method may further include exposing the at least one buried power rail by removing at least a portion of the liner insulating layer on the at least one buried power rail exposed by the at least one backside via hole after the at least one metal catalyst layer is removed.

The forming of the liner dielectric layer may include forming the liner dielectric layer on an inner surface of the at least one backside via hole, and partially removing the liner dielectric layer on the bottom surface of the at least one backside via hole to leave the liner dielectric layer on the side wall of the at least one backside via hole.

The method may further include forming a diffusion barrier layer on the inner surface of the at least one backside via hole from which the liner dielectric layer is partially removed, so as to be connected to the at least one buried power rail, and the buried conductive layer may be formed in the at least one backside via hole so as to be connected to the diffusion barrier layer.

The at least one buried power rail, the at least one metal catalyst layer, and the buried conductive layer may include the same metal.

According to another aspect of the present invention, there is provided a method of forming a semiconductor device, the method including pretreating a semiconductor substrate including at least one buried power rail for power transmission, based on chemical reaction by supplying a pretreatment gas for surface treatment onto a backside of the semiconductor substrate, forming at least one metal catalyst layer on the backside of the semiconductor substrate so as to be at least partially aligned with the at least one buried power rail, forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using metal assisted chemical etching (MACE) and to stop the etching of the semiconductor substrate when a liner insulating layer on the at least one buried power rail is at least partially exposed, removing the at least one metal catalyst layer descended to a bottom surface of the at least one backside via hole, removing at least a portion of the liner insulating layer on the at least one buried power rail exposed by the at least one backside via hole, forming a liner dielectric layer on at least a side wall of the at least one backside via hole, forming a diffusion barrier layer on an inner surface of the at least one backside via hole from which the liner dielectric layer is partially removed, so as to be connected to the at least one buried power rail, and forming a buried conductive layer to bury the at least one backside via hole.

According to another aspect of the present invention, there is provided a substrate processing system for forming a semiconductor device, the substrate processing system including a substrate in-out module for loading or unloading a semiconductor substrate including at least one buried power rail for power transmission, a metal deposition module for performing in situ a pretreatment process for pretreating the semiconductor substrate based on chemical reaction by supplying a pretreatment gas for surface treatment onto a backside of the semiconductor substrate, and a deposition process for forming at least one metal catalyst layer on the backside of the semiconductor substrate so as to be at least partially aligned with the at least one buried power rail, and a metal assisted chemical etching (MACE) module for forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using MACE.

The substrate processing system may further include a dielectric layer deposition module for forming a liner dielectric layer on at least a side wall of the at least one backside via hole, and a wet etching module for removing the at least one metal catalyst layer descended to a bottom surface of the at least one backside via hole.

The metal deposition module may include a pretreatment chamber for performing the pretreatment process, and a deposition chamber for performing the deposition process, and the semiconductor substrate may be moved in a vacuum atmosphere between the pretreatment chamber and the deposition chamber.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
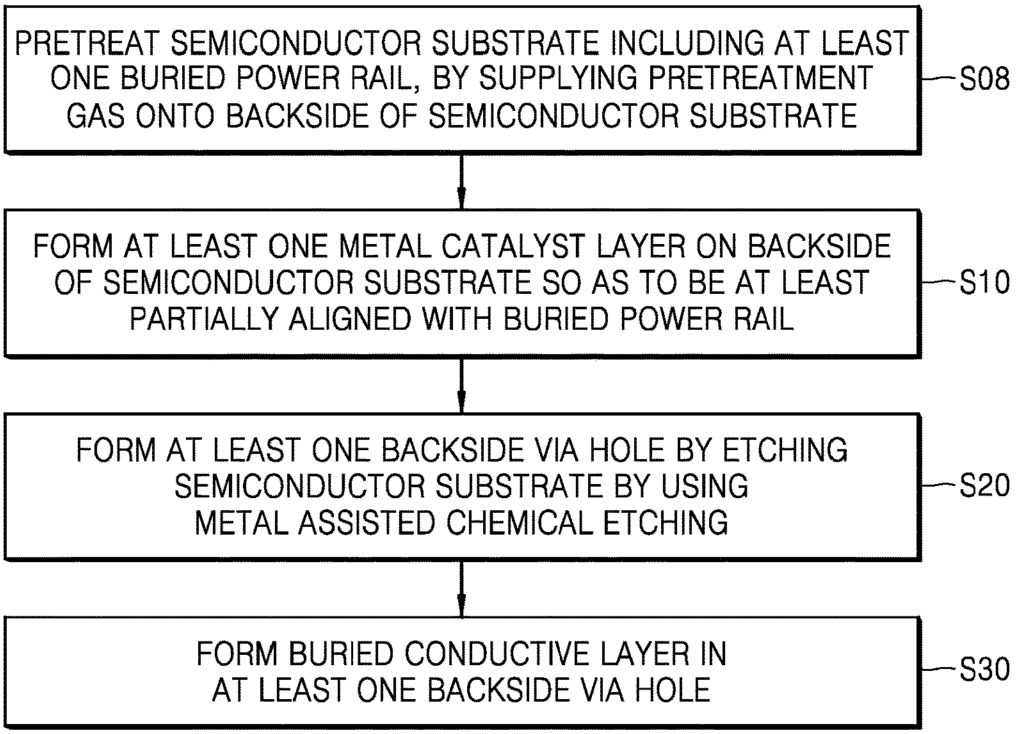
FIG. 1 is a flowchart of a method of forming a semiconductor device, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation. Thus, the embodiments of the invention should not be construed as limited to the particular shapes of regions illustrated herein, but are to include deviations in shapes that result, for example, from manufacturing.

FIG. 1 is a flowchart of a method of forming a semiconductor device 100, according to an embodiment of the present invention, and FIGS. 2 to 15 are cross-sectional views for describing the method of forming the semiconductor device 100, according to an embodiment of the present invention.

Referring to FIGS. 1 to 7, the method of forming the semiconductor device 100 may include pretreating a semiconductor substrate 105 by supplying a pretreatment gas for surface treatment onto a backside 108 of the semiconductor substrate 105 (S08), and forming at least one metal catalyst layer 140 on the backside 108 of the semiconductor substrate 105 (S10). For example, the pretreating (S08) and the forming of the metal catalyst layer 140 (S10) may be performed in situ in one process chamber of one metal deposition module or performed in different process chambers while maintaining a vacuum atmosphere.

Specifically, the semiconductor substrate 105 may refer to a substrate including a semiconductor material, e.g., silicon (Si), germanium (Ge), or silicon-germanium (Si—Ge). The semiconductor material in the semiconductor substrate 105 may have a monocrystalline structure and include epitaxial layers in addition to a bulk monocrystalline structure. The semiconductor substrate 105 may have various shapes, e.g., a wafer shape.

Figure 2:
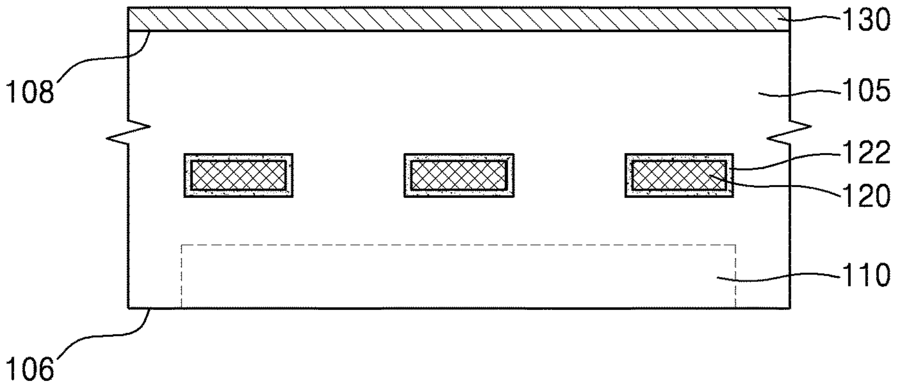
FIGS. 2 to 15 are cross-sectional views for describing a method of forming a semiconductor device, according to an embodiment of the present invention.

A marker structure such as a flat zone or a notch may be formed on the semiconductor substrate 105 to indicate a reference surface. In some embodiments, it may be understood that, in addition to the semiconductor material, the semiconductor substrate 105 further includes a stacked structure formed on the semiconductor material. In FIG. 2, it may be understood that the semiconductor substrate 105 is placed upside down such that a frontside 106 thereof faces downward and the backside 108 thereof faces upward.

As shown in FIG. 2, a device structure 110 may be formed on the semiconductor substrate 105. The device structure 110 may be formed using the semiconductor substrate 105. For example, the device structure 110 may be formed in the frontside 106 of the semiconductor substrate 105, or a partial structure may be formed in the semiconductor substrate 105 and other structures may be stacked on the frontside 106 of the semiconductor substrate 105.

In some embodiments, the device structure 110 may include active devices, e.g., an integrated structure of one or more of field effect transistors (FETs), diodes, and bipolar junction transistors (BJTs). For example, the FETs may have various structures such as planar-gate metal-oxide-semiconductor FETs (MOSFETs), recess-gate MOSFETs, gate-all-around (GAA) MOSFETs, and fin MOSFETs. In addition to the active devices, the device structure 110 may further include passive devices, e.g., an integrated structure of one or more of resistors, inductors, and capacitors.

Multilayer wiring structures for connecting these devices may be further formed on the device structure 110.

At least one buried power rail 120 may be formed in the semiconductor substrate 105. The buried power rail 120 may be used to transmit power to the device structure 110. For example, the buried power rail 120 may be connected to at least one power terminal for driving the device structure 110.

The device structure 110 may include a plurality of active devices each including at least one pair of power terminals. For example, in a MOSFET, a driving voltage Vdd may be applied to a drain electrode, a reference voltage Vss may be connected to a source electrode, and a word line voltage may be applied to a gate electrode. The at least one buried power rail 120 may include a plurality of buried power rails 120 formed in the semiconductor substrate 105 to transmit power to the active devices. The number of buried power rails 120 may be appropriately selected based on the number of power transmission terminals of the device structure 110.

In some embodiments, the buried power rails 120 may be formed to be at least partially surrounded by a liner insulating layer 122. For example, when viewed from the backside 108 of the semiconductor substrate 105, at least top surfaces and side walls of the buried power rails 120 may be surrounded by the liner insulating layer 122. Specifically, when the buried power rails 120 are formed in the semiconductor substrate 105, for insulation between the semiconductor substrate 105 and the buried power rails 120, the buried power rails 120 may be disposed to be entirely surrounded by the liner insulating layer 122. For example, the liner insulating layer 122 may include an appropriate insulating material, e.g., an oxide, a nitride, and/or an oxynitride.

The buried power rails 120 may include a buried conductive material in the liner insulating layer 122. For example, the buried conductive material may include an appropriate conductive material, e.g., tungsten (W) or ruthenium (Ru). The buried power rails 120 may further include a diffusion barrier layer formed on the liner insulating layer 122 before the buried conductive material is formed. Meanwhile, because the diffusion barrier layer is also made of a conductive material, it may be understood that the buried conductive material includes the diffusion barrier layer.

In some embodiments, the buried power rails 120 may be formed in the semiconductor substrate 105 or in an insulating layer on the semiconductor substrate 105. In this case, at least a portion of the insulating layer may be understood as the liner insulating layer 122.

In some embodiments, after the device structure 110 is formed, the semiconductor substrate 105 may be thinned from the backside 108 thereof. For example, the backside 108 of the semiconductor substrate 105 may be thinned through backside etching. As such, a depth from the backside 108 of the semiconductor substrate 105 to the buried power rails 120 may be reduced to about 1000 nm or less, e.g., 100 nm to 500 nm.

The pretreating (S08) and the forming of the metal catalyst layer 140 (S10) will now be described in detail.

The pretreating (S08) may include pretreating the semiconductor substrate 105 based on chemical reaction by supplying a pretreatment gas PG for surface treatment. The pretreating (S08) may not use plasma etching or ion etching and use surface treatment based on chemical reaction.

For example, the pretreating (S08) may use non-plasma thermal activation to prevent plasma damage to the semiconductor substrate 105. For example, the pretreating (S08) may be used to remove a natural oxide layer 112 on the backside 108 of the semiconductor substrate 105, decompose surface residues such as moisture, or perform hydrophilic surface modification.

The forming of the at least one metal catalyst layer 140 (S10) may be performed after the pretreating (S08). For example, the at least one metal catalyst layer 140 may be formed on the backside 108 of the semiconductor substrate 105 so as to be at least partially aligned with the at least one buried power rail 120. The pretreating (S08) may increase adhesive force between the semiconductor substrate 105 and the metal catalyst layer 140 through surface cleaning and facilitate hole transfer from the metal catalyst layer 140 to the semiconductor substrate 105 by removing the natural oxide layer 112.

Figure 3:
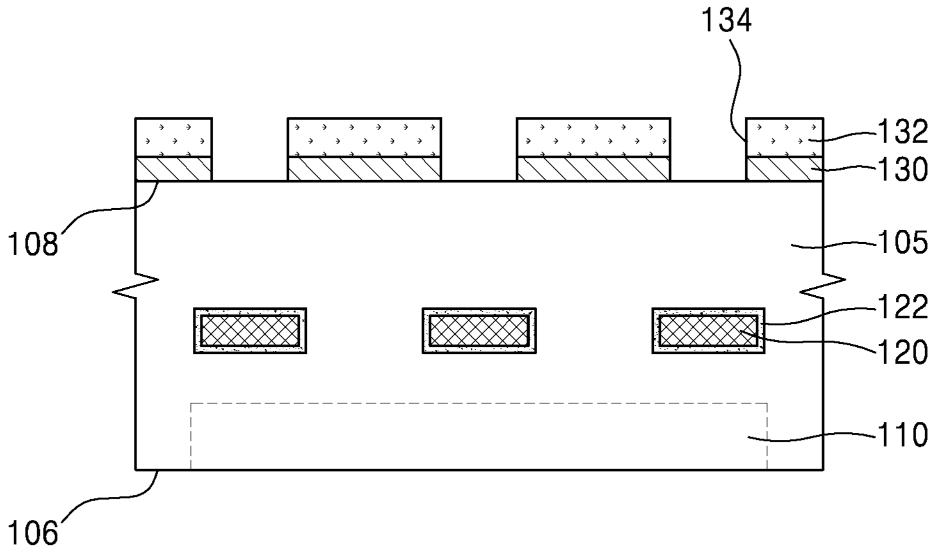

Referring to FIGS. 2 and 3, a passivation insulating layer 130 having at least one opening 134 at least partially aligned with the at least one buried power rail 120 may be formed on the backside 108 of the semiconductor substrate 105. For example, a plurality of openings 134 in the passivation insulating layer 130 may be at least partially and separately aligned with the buried power rails 120.

Specifically, as shown in FIG. 2, the passivation insulating layer 130 may be formed on the backside 108 of the semiconductor substrate 105. For example, the passivation insulating layer 130 may include an appropriate insulating material, e.g., an oxide, a nitride, and/or an oxynitride.

As shown in FIG. 3, a photoresist layer 132 may be formed on the passivation insulating layer 130 to expose the openings 134. For example, the photoresist layer 132 may be formed entirely on the passivation insulating layer 130 and then patterned using exposure and development processes to expose upper portions of the openings 134.

Then, the openings 134 may be formed by etching the passivation insulating layer 130 by using the photoresist layer 132 as an etch mask. For example, the passivation insulating layer 130 may be etched using dry etching, e.g., plasma etching.

Figure 4:
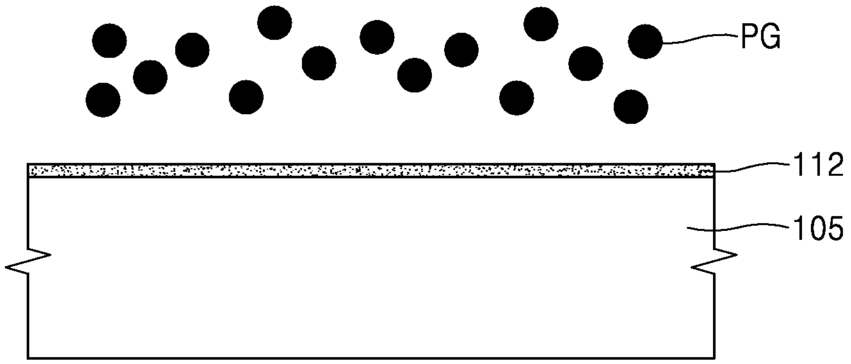
Figure 5:
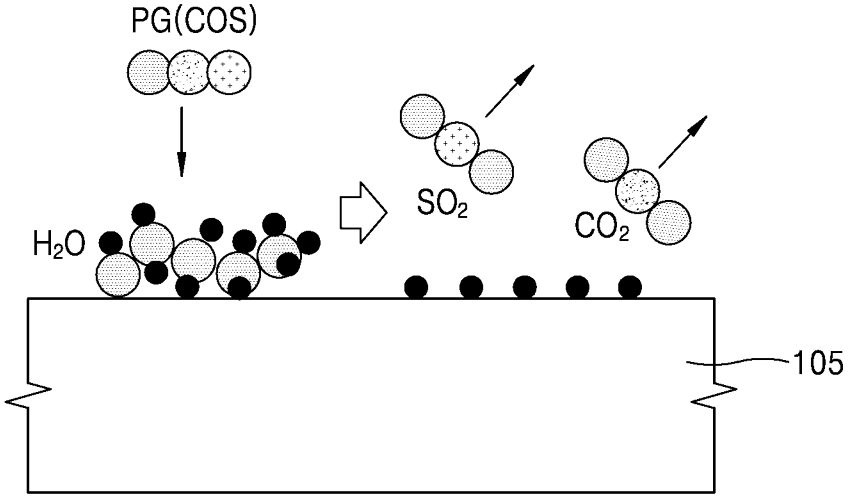

Referring to FIGS. 4 and 5, the semiconductor substrate 105 may be pretreated by supplying the pretreatment gas PG onto the backside of the semiconductor substrate 105 (S08). For example, in the pretreating (S08), the surface of the backside of the semiconductor substrate 105 exposed by the openings 134 may be pretreated. It may be understood that FIGS. 4 and 5 are enlarged views of the backside of the semiconductor substrate 105 exposed by one opening 134 in FIG. 3.

Specifically, in the pretreating (S08), the natural oxide layer 112 on the backside of the semiconductor substrate 105 may be removed or a surface adsorbed layer may be decomposed. The natural oxide layer 112 may spontaneously grow without gas supply when the semiconductor substrate 105 is exposed to the atmosphere, and have a small thickness of several nm.

In some embodiments, as shown in FIG. 5, the pretreatment gas PG may include carbonyl sulfide (COS) gas. The COS gas may be activated by certain thermal energy and used to remove the natural oxide layer 112 or decompose surface moisture or the like. For example, the thermal activation may be performed by heating the semiconductor substrate 105 or the pretreatment gas PG to a certain temperature, e.g., 300° C. to 500° C.

The COS gas may be used to remove the natural oxide layer 112 as shown in FIG. 4 or to decompose moisture ($H_2O$) adsorbed onto the backside of the semiconductor substrate 105 and remove oxygen as shown in FIG. 5. As such, the surface of the semiconductor substrate 105 may have a hydrogen reactive element and thus have hydrophilicity. Therefore, as the pretreatment gas PG, the COS gas may be used for various purposes, e.g., the removal of the natural oxide layer 112, the moisture decomposition, and the hydrophilic treatment.

In some embodiments, the pretreatment gas PG may include radicals activated in a remote plasma generator to remove the natural oxide layer 112. The radicals may have an activated form of COS gas or halogen gas.

In some embodiments, the pretreating (S08) may include removing the natural oxide layer 112 on the backside of the semiconductor substrate 105, and modifying the backside of the semiconductor substrate 105 to have hydrophilic termination. For example, the removing of the natural oxide layer 112 may be performed by providing the COS gas onto the backside of the semiconductor substrate 105, and the modifying of the backside of the semiconductor substrate 105 may be performed by supplying hydrogen ($H_2$) gas onto the backside of the semiconductor substrate 105. Specifically, the COS gas may be supplied onto the backside of the semiconductor substrate 105 to remove the natural oxide layer 112 and perform surface treatment, and then the $H_2$ gas may be supplied to modify the surface to be hydrophilic.

Figure 6:
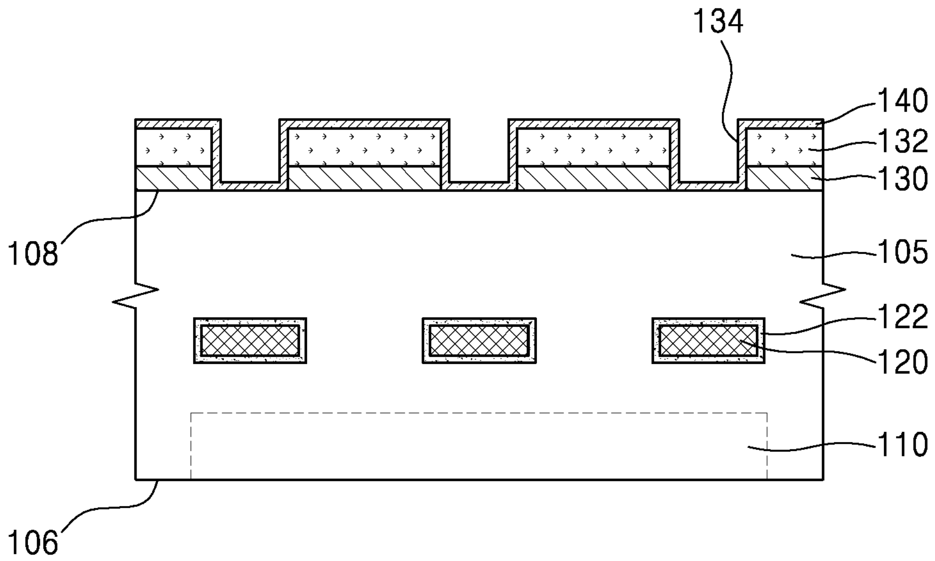

Referring to FIG. 6, a metal catalyst layer 140 may be formed on the passivation insulating layer 130 on which the photoresist layer 132 remains. The metal catalyst layer 140 may include a metal catalyst for metal assisted chemical etching (MACE) as will be described below. In some embodiments, the MACE may also be called catalyst assisted chemical etching in that a catalytic metal is used.

For example, the metal catalyst layer 140 may include various metals serving as a catalyst. For example, the metal catalyst layer 140 may include ruthenium (Ru), tungsten (W), platinum (Pt), or gold (Au) as a catalytic metal. In some embodiments, as the catalytic metal, Au or copper (Cu) may leave deep-level impurities in the semiconductor substrate 105 and thus be excluded, and Ru or W may be selected. Furthermore, as the catalytic metal, Ru has a lower resistivity than W. The metal catalyst layer 140 may be formed using an appropriate deposition method, e.g., chemical vapor deposition (CVD) or atomic layer deposition (ALD).

Figure 7:
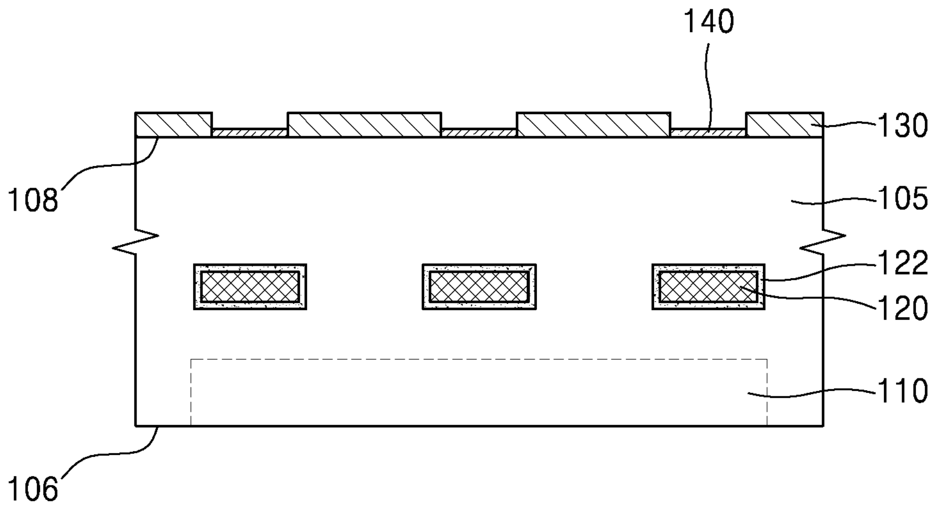

Referring to FIG. 7, a plurality of metal catalyst layers 140 remaining in the openings 134 may be formed by removing a portion of the metal catalyst layer 140 on the photoresist layer 132 by using a lift-off method. As such, the metal catalyst layers 140 may be separately formed in the openings 134 of the passivation insulating layer 130.

The metal catalyst layers 140 may be formed on the backside 108 of the semiconductor substrate 105 so as to be at least partially aligned with the buried power rails 120. The number of metal catalyst layers 140 may be appropriately selected to be one or more based on the number of backside via holes 145 connected to the buried power rails 120 as will be described below.

In some embodiments, a diameter or a width of the metal catalyst layers 140 may be less than or equal to a width of the buried power rails 120. When viewed from a cross-section of the semiconductor substrate 105, the metal catalyst layers 140 maybe separately and vertically aligned with and spaced apart from the buried power rails 120 or vertically spaced apart from the buried power rails 120 within the width of the buried power rails 120. According to the above-described structure, when viewed through the backside 108 of the semiconductor substrate 105, the metal catalyst layers 140 may be disposed to overlap with portions of the buried power rails 120 or to be included in the buried power rails 120.

According to the above description, the metal catalyst layers 140 may be formed at a relatively low cost by using a lift-off method.

However, because precise fine patterns may not be easily formed using the lift-off method, in another embodiment of the present invention, when precise fine patterns are required, the metal catalyst layers 140 may be formed using a photolithography method instead of the lift-off method.

Figure 16:
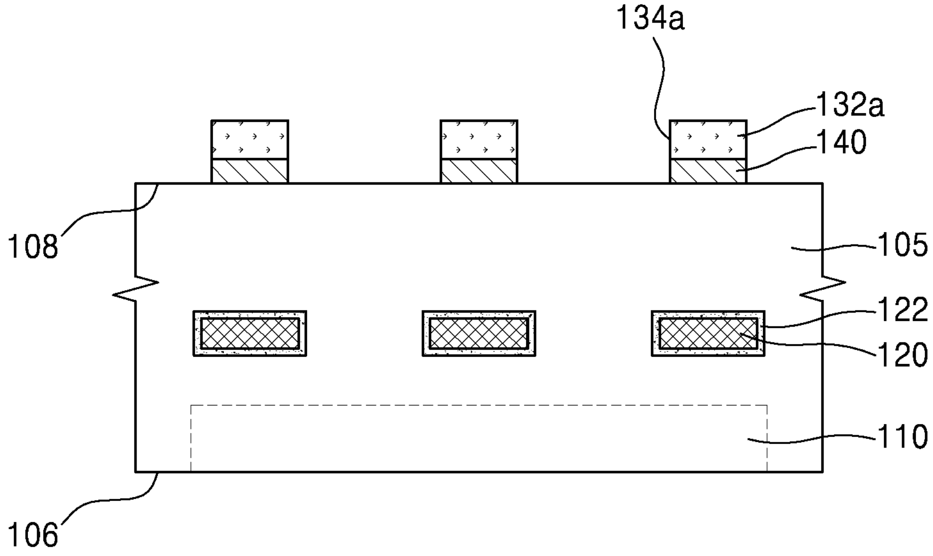
FIG. 16 is a cross-sectional view for describing a part of a method of forming a semiconductor device, according to another embodiment of the present invention.

Meanwhile, in another embodiment of the present invention, the metal catalyst layer 140 may be formed using a deposition and patterning method as shown in FIG. 16.

Referring to FIG. 16, after the metal catalyst layer 140 is formed on the backside 108 of the semiconductor substrate 105, a photoresist layer 132*a* having openings 134*a* may be formed thereon. The photoresist layer 132*a* may be formed in the form of patterns by using a coating process, an exposure process, and a development process. Then, the metal catalyst layers 140 at least partially aligned with the buried power rails 120 may be formed by etching the metal catalyst layer 140 by using the photoresist layer 132*a* as an etch mask. In this case, the passivation insulating layer 130 may be omitted.

Referring back to FIGS. 1 and 8, at least one backside via hole 145 may be formed by etching the semiconductor substrate 105 by using MACE (S20). For example, in this step S20, the at least one backside via hole 145 may be formed by supplying an etchant such as etching solution to the semiconductor substrate 105 to anisotropically etch the semiconductor substrate 105 between the at least one metal catalyst layer 140 and the at least one buried power rail 120 while the at least one metal catalyst layer 140 is descending into the semiconductor substrate 105 by using the MACE.

Figure 8:
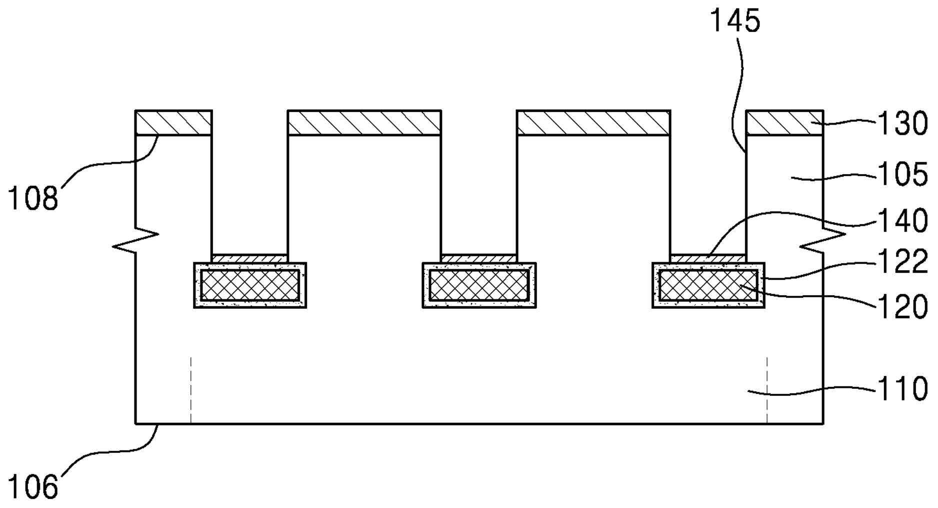

Specifically, as shown in FIG. 8, the MACE may be induced by supplying the etchant to the semiconductor substrate 105. For example, to etch the semiconductor substrate 105, the etchant may include a mixture of an oxidizer and an oxide remover. The oxidizer may include $HNO_3$ or $H_2O_2$, and the oxide remover may include a fluorine (F) or chlorine (CI) compound, e.g., hydrogen fluoride (HF). For example, the etchant may be provided onto the semiconductor substrate 105 in the form of droplets, or the semiconductor substrate 105 may be dipped in the etchant to supply the etchant to the semiconductor substrate 105.

Although normal wet etching induces isotropic etching, the MACE may be understood as a kind of wet etching using an etchant but may induce anisotropic etching. That is, when the metal catalyst layers 140 are not present, the etching of the semiconductor substrate 105 by the etchant may proceed very slowly. However, according to the MACE, the semiconductor substrate 105 may be rapidly etched under the metal catalyst layers 140, the metal catalyst layers 140 may descend, and thus anisotropic etching may be performed.

For example, when the metal catalyst layers 140 are present on the semiconductor substrate 105, the oxidizer may be reduced by receiving electrons from the metal catalyst layers 140. Furthermore, electrons may be transferred between the semiconductor material and the metal catalyst and the oxidizer may be supplied to oxidize and etch the semiconductor material directly under the metal catalyst layers 140. As a result, the MACE may be similar to a kind of micro galvanic cell reaction in which reduction and oxidation simultaneously occur in a pair.

As such, according to the MACE, the semiconductor substrate 105 under the metal catalyst layers 140 may be locally etched and material transfer may occur at an interface therebetween. As such, the metal catalyst layers 140 may fall into the semiconductor substrate 105 while the semiconductor substrate 105 is being etched under the metal catalyst layers 140, and thus anisotropic etching may be induced. As such, a plurality of backside via holes 145 may be formed using the MACE without causing plasma damage.

In some embodiments, in the forming of the at least one backside via hole 145 (S20), the etching of the semiconductor substrate 105 by the MACE may be at least partially stopped on the at least one buried power rail 120. For example, the etching of the plurality of backside via holes 145 may be separately and at least partially stopped on the plurality of buried power rails 120.

Specifically, in the forming of the backside via holes 145, the etching of the semiconductor substrate 105 may be stopped when the metal catalyst layers 140 are at least partially in contact with the liner insulating layer 122. That is, the MACE may be automatically stopped when the etching of the semiconductor substrate 105 between the metal catalyst layers 140 and the buried power rails 120 is completed and thus the metal catalyst layers 140 meet the liner insulating layer 122 on the buried power rails 120.

For example, when the metal catalyst layers 140 are entirely aligned with the buried power rails 120 on the cross-section of the semiconductor substrate 105, the backside via holes 145 may be formed to be aligned with the buried power rails 120 on the buried power rails 120.

As another example, when the metal catalyst layers 140 are disposed within the buried power rails 120 on the cross-section of the semiconductor substrate 105, the backside via holes 145 may be formed to be aligned with the buried power rails 120 in a width range of the buried power rails 120. In this case, the etching of the backside via holes 145 may be entirely stopped at the liner insulating layer 122 on the buried power rails 120, and bottom surfaces of the metal catalyst layers 140 descended to bottom surfaces of the backside via holes 145 may be entirely in contact with the liner insulating layer 122.

Meanwhile, in some embodiments, the metal catalyst layers 140 may be only partially aligned with the buried power rails 120. In this case, portions of the backside via holes 145 may be connected to the liner insulating layer 122 on the buried power rails 120, and the other portions may be partially connected to bottoms of the buried power rails 120 along sides thereof.

Figure 9:
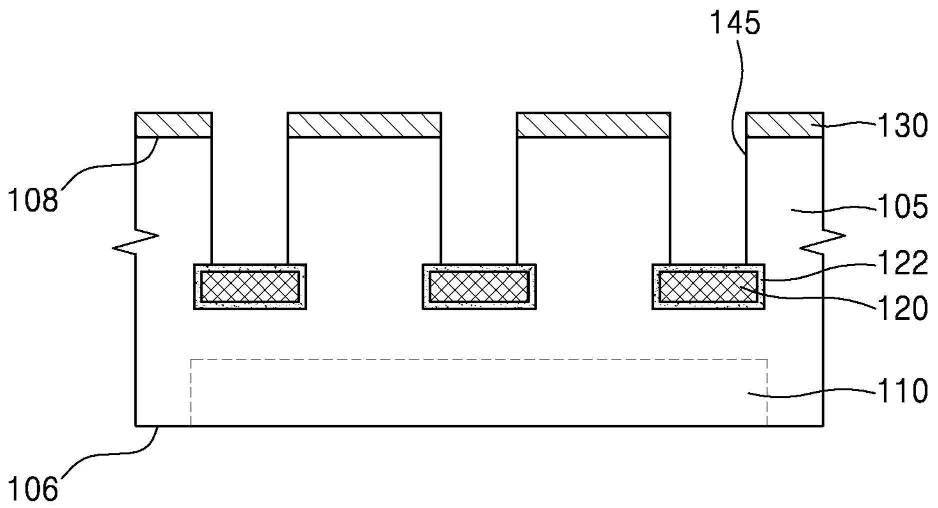

Referring to FIG. 9, the metal catalyst layers 140 descended to the bottom surfaces of the backside via holes 145 may be removed. As such, the liner insulating layer 122 on the buried power rails 120 may be exposed by the backside via holes 145. For example, the metal catalyst layers 140 may be removed using wet etching or chemical dry etching so as not to cause plasma damage in the semiconductor substrate 105. As another example, plasma etching may be used because a thickness of the metal catalyst layers 140 is not large.

Figure 10:
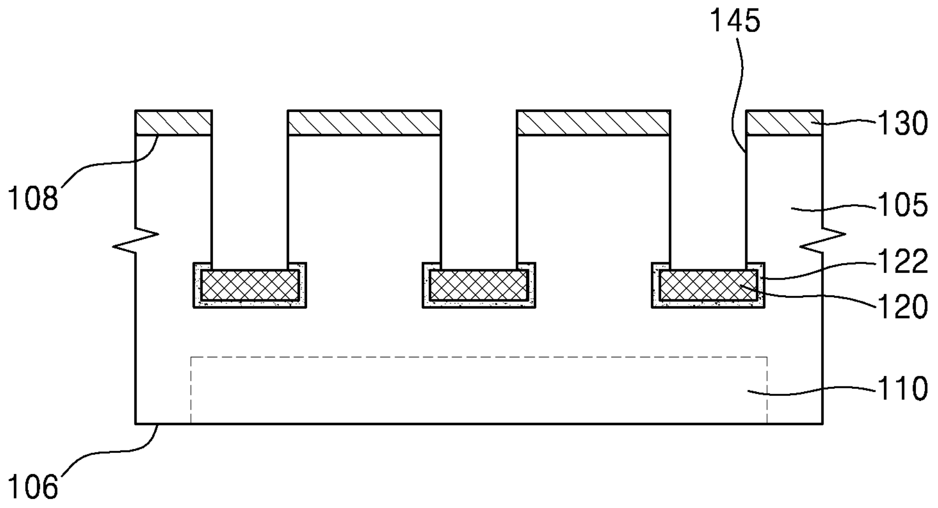

Referring to FIG. 10, after the metal catalyst layers 140 are removed, at least portions of the liner insulating layer 122 on the buried power rails 120 exposed by the backside via holes may be removed. As such, the buried power rails 120 may be exposed by the backside via holes 145.

For example, the liner insulating layer 122 may be removed using wet etching or chemical dry etching so as not to cause plasma damage in the semiconductor substrate 105. As another example, plasma etching may be used because a thickness of the liner insulating layer 122 is not large.

Figure 11:
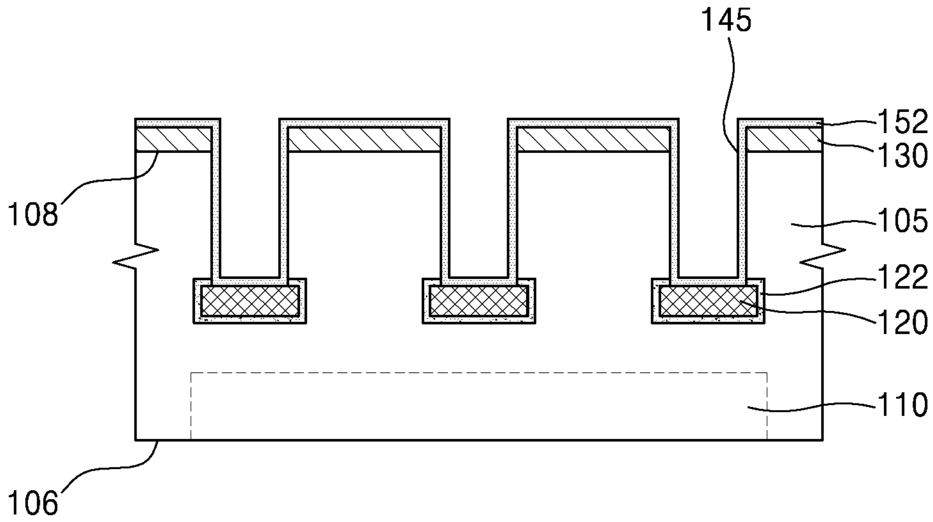
Figure 12:
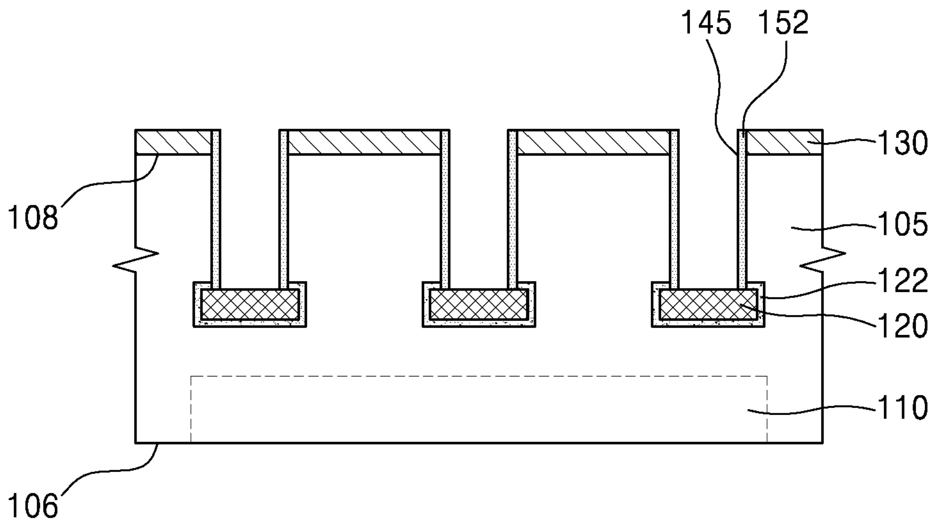

Referring to FIGS. 11 and 12, a liner dielectric layer 152 may be formed on at least side walls of the backside via holes 145. For example, the liner dielectric layer 152 may include a monolayer or multilayer structure of an oxide, an insulator, and an oxynitride.

Specifically, as shown in FIG. 11, the liner dielectric layer 152 may be formed on at least inner surfaces of the backside via holes 145. Then, as shown in FIG. 12, the liner dielectric layer 152 on the bottom surfaces of the backside via holes 145 may be partially removed to leave the liner dielectric layer 152 on the side walls of the backside via holes 145. For example, the partially removing of the liner dielectric layer 152 may use anisotropic plasma etching.

Referring to FIGS. 1 and 13 to 15, a buried conductive layer 156 may be formed in the at least one backside via hole 145 (S30).

Figure 13:
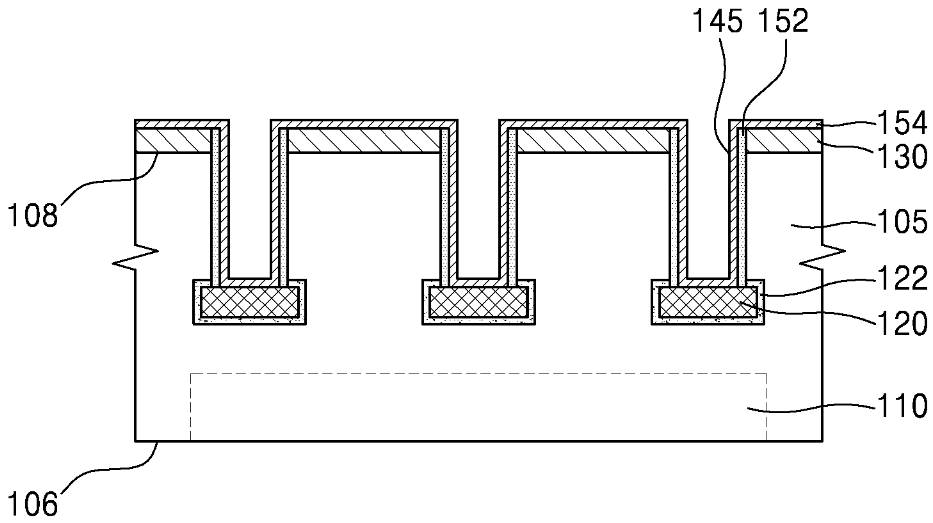

Specifically, as shown in FIG. 13, a diffusion barrier layer 154 may be formed on the inner surfaces of the backside via holes 145 from which the liner dielectric layer 152 is partially removed, so as to be connected to the buried power rails 120. For example, the diffusion barrier layer 154 may include a metal or a metal nitride, e.g., titanium (Ti), tantalum (Ta), titanium nitride (TiN), or tantalum nitride (TaN), or include a stacked structure thereof.

Figure 14:
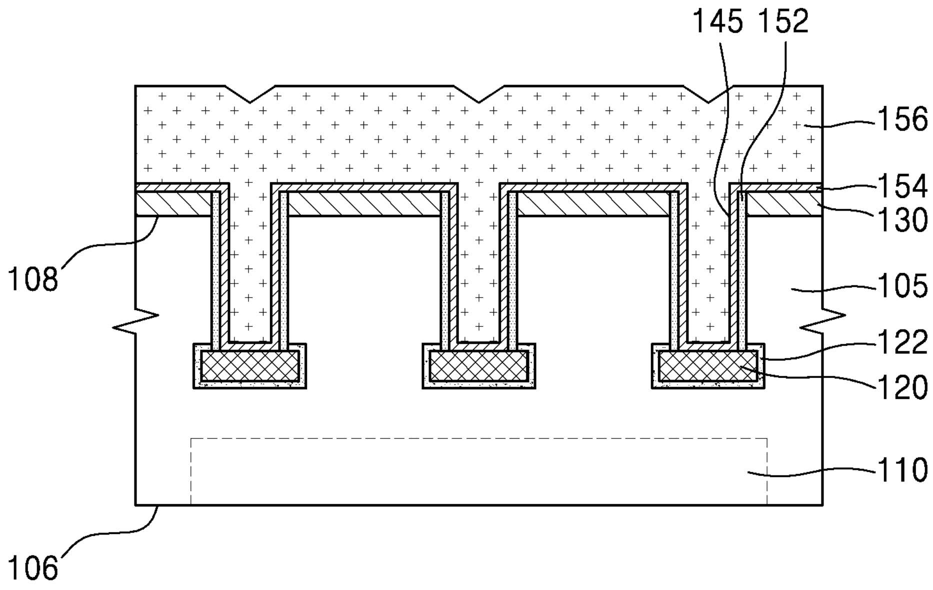

Then, as shown in FIG. 14, the buried conductive layer 156 may be formed to at least bury the backside via holes 145. The buried conductive layer 156 may be connected to the diffusion barrier layer 154. For example, the buried conductive layer 156 may include an appropriate metal, e.g., Ru, W, or Cu.

Figure 15:
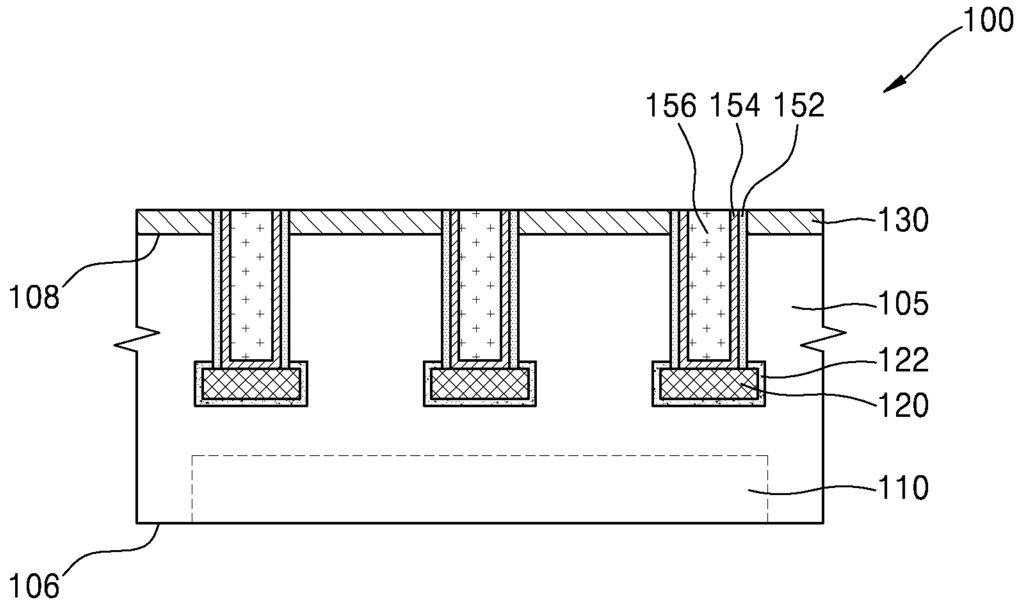

Then, as shown in FIG. 15, the buried conductive layer 156 may be planarized and separated into a plurality of pieces. For example, the buried conductive layer 156 may be planarized using chemical mechanical polishing (CMP) or etch back.

When the buried conductive layer 156 is planarized, a portion of the diffusion barrier layer 154 on the backside 108 of the semiconductor substrate 105 may also be removed to separate the diffusion barrier layer 154 into a plurality of pieces.

As such, the buried conductive layers 156 may be separately connected to the buried power rails 120 through the diffusion barrier layers 154. The buried conductive layers 156 may be used as backside via electrodes for connecting the buried power rails 120 to an external terminal.

According to the above-described structure, the buried power rails 120 may be connected to an external power source by using the buried conductive layers 156, i.e., the backside via electrodes. Therefore, a connection resistance between the buried power rails 120 and the external power source may be greatly lowered to reduce a voltage drop due to wiring, and thus power transmission efficiency may be increased.

The semiconductor device 100 manufactured as described above may include the semiconductor substrate 105, the at least one buried power rail 120 formed in the semiconductor substrate 105, and the buried conductive layer 156 connected to the buried power rail 120 through the backside 108 of the semiconductor substrate 105. The at least one buried power rail 120, e.g., the plurality of buried power rails 120, may be formed in the semiconductor substrate 105 to transmit power to the device structure 110. The buried conductive layers 156, i.e., the backside via electrodes, may be formed by burying the backside via holes 145 connected to the buried power rails 120.

Therefore, according to the above-described semiconductor device 100 and the method of forming the same, by using MACE to form the backside via holes 145 for backside via electrodes connected to the buried power rail 120 in the semiconductor substrate 105, plasma damage in the backside via holes 145 may be suppressed and a manufacturing cost may be reduced. Furthermore, by pretreating the surface of the backside of the semiconductor substrate 105 using chemical reaction before the metal catalyst layer 140 is formed, a natural oxide layer may be removed and a surface adsorbed layer may be decomposed. In addition, by modifying the surface to be hydrophilic, adsorption force of the metal catalyst layer 140 may be increased and ion migration may be promoted in the MACE step.

An apparatus for manufacturing the above-described semiconductor device 100 will now be described.

Figure 17:
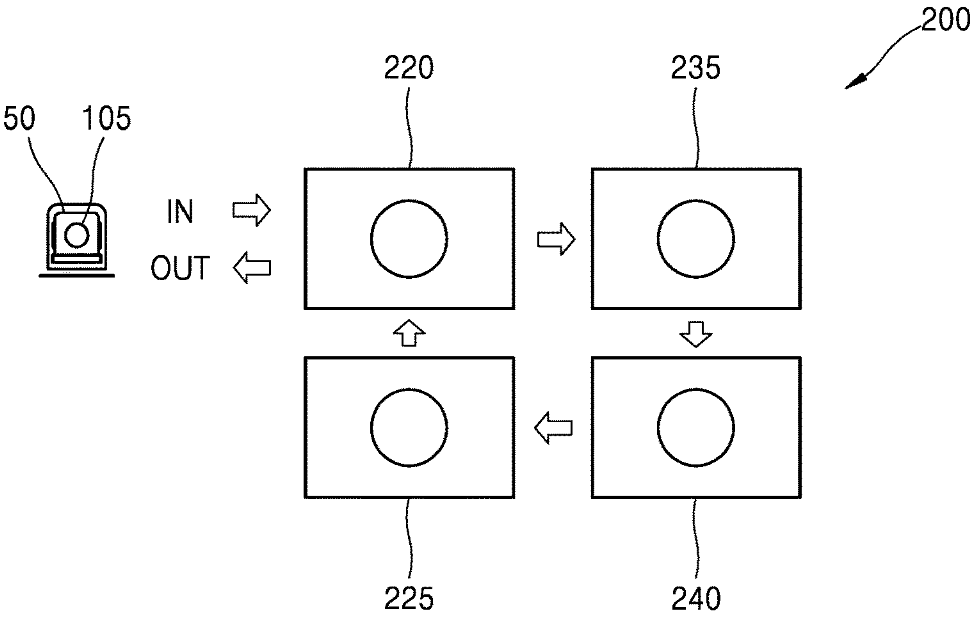
FIG. 17 is a schematic view of a substrate processing system for forming a semiconductor device, according to an embodiment of the present invention.

FIG. 17 is a schematic view of a substrate processing system 200 for forming the semiconductor device 100, according to an embodiment of the present invention.

Referring to FIG. 17, the substrate processing system 200 may include two or more of a metal deposition module 220, a MACE module 235, a wet etching module 240, and a dielectric layer deposition module 225.

Specifically, the metal deposition module 220 may be used to form the at least one metal catalyst layer 140 on the backside of the semiconductor substrate so as to be at least partially aligned with the at least one buried power rail 120. For example, the metal deposition module 220 may be a sputtering, CVD, or ALD device for metal deposition.

The metal deposition module 220 may also be used to form the buried conductive layer 156 to bury the at least one backside via hole 145. In this case, both the metal catalyst layer 140 and the buried conductive layer 156 may be formed in the metal deposition module 220 and thus the substrate processing system 200 may be simplified. When the metal catalyst layer 140 and the buried conductive layer 156 include the same metal, the metal catalyst layer 140 and the buried conductive layer 156 may be formed through the same process in the metal deposition module 220.

In some embodiments, when two or all of the buried power rail 120, the metal catalyst layer 140, and the buried conductive layer 156 include the same metal, the same metal may be deposited through the same or similar processes in the metal deposition module 220. For example, two or all of the buried power rail 120, the metal catalyst layer 140, and the buried conductive layer 156 may equally include Ru, W, or Cu. Specifically, Ru or W may be equally used when deep-level impurities need to be lowered, or Ru may be equally used when a low resistivity is considered.

However, in a modified example of the current embodiment, when the buried power rail 120, the metal catalyst layer 140, and the buried conductive layer 156 are separately deposited, different metals may be used.

The metal deposition module 220 may be used to perform a pretreatment process in addition to the above-described deposition process. For example, a pretreatment process for pretreating the semiconductor substrate 105 based on chemical reaction by supplying a pretreatment gas for surface treatment onto the backside of the semiconductor substrate 105 may be performed in the metal deposition module 220. The pretreatment process may be performed before the deposition process, and the deposition process and the pretreatment process may be performed in situ in the metal deposition module 220. Herein, in situ processing may mean that processes are sequentially performed in the metal deposition module 220 without breaking a vacuum atmosphere. For example, the pretreatment process and the deposition process may be sequentially performed in one process chamber of the metal deposition module 220 while the semiconductor substrate 105 is being seated and then not moved, or performed in different process chambers while maintaining a vacuum atmosphere.

The MACE module 235 may be used to form the at least one backside via hole 145 by supplying an etchant to the semiconductor substrate 105 to anisotropically etch the semiconductor substrate 105 between the at least one metal catalyst layer 140 and the at least one buried power rail 120 while the at least one metal catalyst layer 140 is descending into the semiconductor substrate 105 by using the MACE. For example, the MACE module 235 may be configured as a wet etching device having an etch bath filled with an etchant or an etchant ejection device capable of ejecting an etchant onto the semiconductor substrate 105.

The wet etching module 240 may be used to remove the at least one metal catalyst layer 140 descended to a bottom surface of the at least one backside via hole 145. The wet etching module 240 may also be used to clean the semiconductor substrate 105.

In some embodiments, the MACE module 235 and the wet etching module 240 may be integrated into one and different etchants may be used for the MACE and the etching of the metal catalyst layer 140.

The dielectric layer deposition module 225 may be used to form the liner dielectric layer 152 on at least a side wall of the at least one backside via hole 145. For example, the dielectric layer deposition module 225 may be configured as a CVD or ALD device.

To manufacture the semiconductor device 100, in the substrate processing system 200, the semiconductor substrate 105 may be loaded into the metal deposition module 220. For example, the semiconductor substrate 105 may be stored in a container 50 and placed on a loading port of the metal deposition module 220.

In some embodiments, the container 50 may use an airtight container such as a front open unified pod (FOUP). A plurality of semiconductor substrates 105, e.g., wafers, may be stored in the container 50. The container 50 may be placed on the loading port by a transfer device (not shown) such as an overhead transfer, an overhead conveyor, or an automated guided vehicle, a robot, or an operator in a factory.

The semiconductor substrate 105 may be loaded into the metal deposition module 220 to form the metal catalyst layer 140 on the backside 108 thereof, transferred to the MACE module 235 to etch a portion thereof and form the backside via hole 145, transferred to the wet etching module 240 to etch the metal catalyst layer 140, transferred to the dielectric layer deposition module 225 to form the liner dielectric layer 152, and transferred to the metal deposition module 220 to form the buried conductive layer 156.

According to the substrate processing system 200, most of the process of forming the backside via hole 145 and the buried conductive layer 156 may be performed in a single system.

Figure 18:
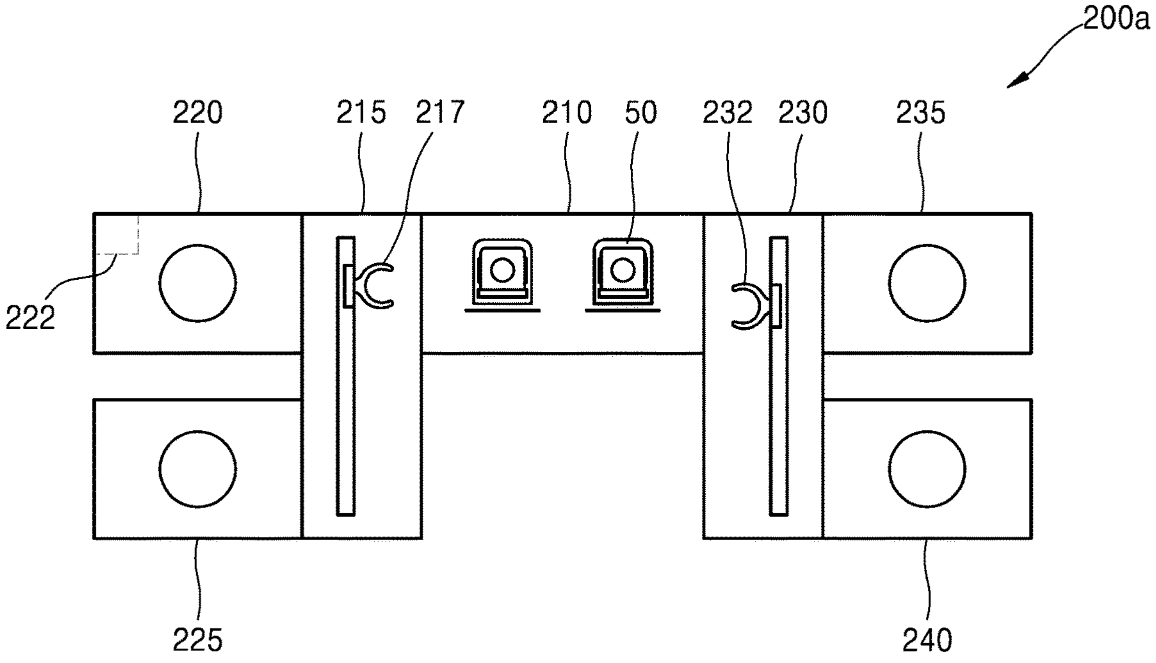
FIG. 18 is a schematic view of a substrate processing system for forming a semiconductor device, according to another embodiment of the present invention.

FIG. 18 is a schematic view of a substrate processing system 200*a* for forming the semiconductor device 100, according to another embodiment of the present invention. The substrate processing system 200*a* may be obtained by adding or modifying some components to or from the substrate processing system 200 of FIG. 17, and thus a repeated description therebetween is not provided herein.

Referring to FIG. 18, the substrate processing system 200*a* may include a substrate in-out module 210, the metal deposition module 220, the MACE module 235, the wet etching module 240, and the dielectric layer deposition module 225.

The metal deposition module 220 and the dielectric layer deposition module 225 may perform processes in a vacuum state, and the MACE module 235 and the wet etching module 240 may perform processes in an air state. The substrate in-out module 210 may load or unload the container 50 in the air state and be switched to the vacuum state to transfer the semiconductor substrate 105 from the substrate in-out module 210 to the metal deposition module 220 or the dielectric layer deposition module 225. The substrate in-out module 210 may load the container 50 in the air state and be maintained in the air state to transfer the semiconductor substrate 105 from the substrate in-out module 210 to the MACE module 235 or the wet etching module 240.

Additionally, a first transfer module 215 may be further provided between the substrate in-out module 210 and the metal deposition module 220 and between the substrate in-out module 210 and the dielectric layer deposition module 225. A transfer robot 217 may be mounted in the first transfer module 215. The first transfer module 215 may transfer the semiconductor substrate 105 between the substrate in-out module 210 and the metal deposition module 220, between the substrate in-out module 210 and the dielectric layer deposition module 225, or between the metal deposition module 220 and the dielectric layer deposition module 225 in the vacuum state.

Additionally, a second transfer module 230 may be further provided between the substrate in-out module 210 and the MACE module 235 and between the substrate in-out module 210 and the wet etching module 240. A transfer robot 232 may be mounted in the second transfer module 230. The second transfer module 230 may transfer the semiconductor substrate 105 between the substrate in-out module 210 and the MACE module 235, between the substrate in-out module 210 and the wet etching module 240, or between the MACE module 235 and the wet etching module 240 in the air state.

Optionally, the container 50 in the substrate in-out module 210 may be rotated toward the first or second transfer module 215 or 230 to allow access by the transfer robot 217 in the first transfer module 215 or the transfer robot 232 in the second transfer module 230.

Optionally, buffer modules may be further provided between the substrate in-out module 210 and the first transfer module 215 and/or between the substrate in-out module 210 and the second transfer module 230 to appropriately transfer or rotate the semiconductor substrate 105.

Optionally, an external remote plasma generator 222 may be connected to the metal deposition module 220. Therefore, the metal deposition module 220 may receive radicals activated in the remote plasma generator 222, without generating plasma in an internal process chamber for a pretreatment process or a deposition process. For example, in a pretreatment step, the metal deposition module 220 may receive, as a pretreatment gas, radicals activated in the remote plasma generator 222. The remote plasma generator 222 may be placed above or near the process chamber of the metal deposition module 220.

Figure 19:
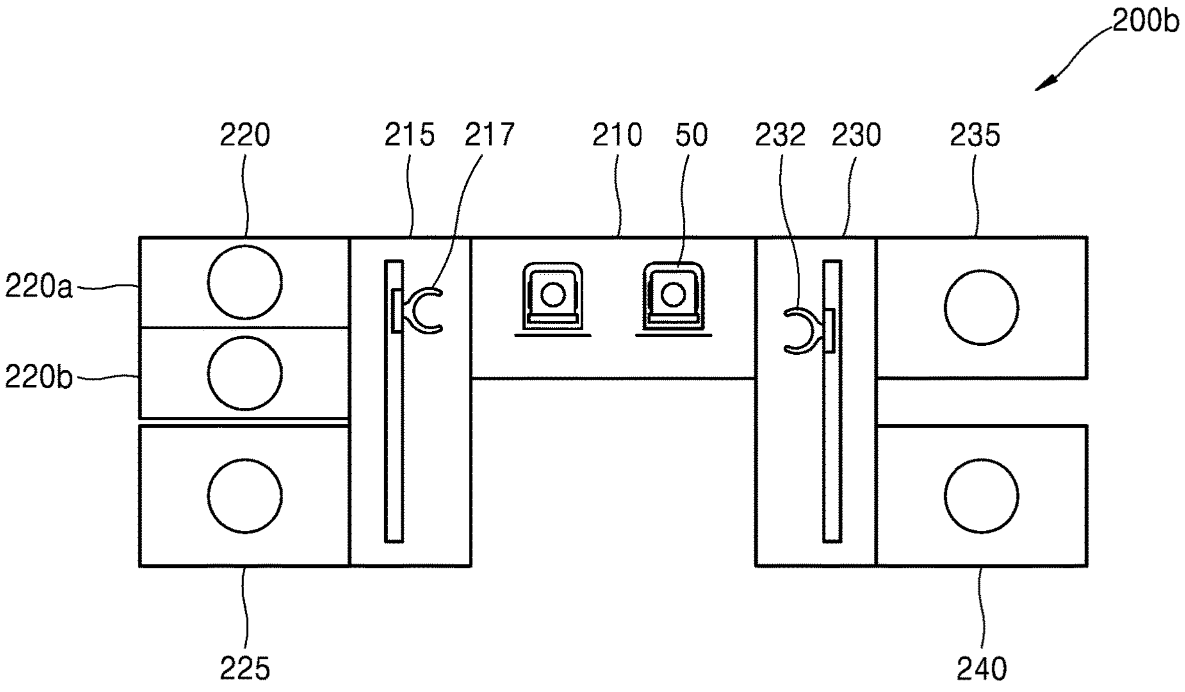
FIG. 19 is a schematic view of a substrate processing system for forming a semiconductor device, according to another embodiment of the present invention.

FIG. 19 is a schematic view of a substrate processing system 200*b* for forming the semiconductor device 100, according to another embodiment of the present invention. The substrate processing system 200*b* may be obtained by adding or modifying some components to or from the substrate processing system 200 or 200*a*, and thus a repeated description therebetween is not provided herein.

Referring to FIG. 19, the metal deposition module 220 may include a pretreatment chamber 220*a* for performing a pretreatment process, and a deposition chamber 220*b* for performing a deposition process. In this case, the semiconductor substrate 105 may be moved between the pretreatment chamber 220*a* and the deposition chamber 220*b* while maintaining a vacuum atmosphere. Therefore, when the pretreatment process and the deposition process are performed, because the semiconductor substrate 105 is moved from the pretreatment chamber 220*a* to the deposition chamber 220*b* in the vacuum atmosphere without being exposed to the air, it may be regarded that the pretreatment process and the deposition process are performed in situ in the metal deposition module 220.

According to the above-described substrate processing systems 200, 200*a*, and 200*b*, the loading of the semiconductor substrate 105, the forming of the metal catalyst layer 140, the liner dielectric layer 152, and the buried conductive layer 156, the etching of the semiconductor substrate 105 and the metal catalyst layer 140 to form the backside via hole 145, etc. may all be performed within the same system. As such, because the deposition process, the etching process, etc. may be performed within one substrate processing system 200*a*, the transfer of the container 50 may be minimized and a process time may be shortened to ensure economic feasibility.

In the above-described method and substrate processing systems 200, 200*a*, and 200*b* for forming the semiconductor device 100, the buried power rails 120 are used to transmit power to the device structure 110. However, in a modified example of the afore-described embodiments, the buried power rails 120 may be used for signal transmission as well as power transmission. Thus, when used for signal transmission, the buried power rails 120 may also be called buried conductive lines. Accordingly, the buried power rails 120 may be replaced by the buried conductive lines in the above descriptions, and the backside via holes 145 may be formed by etching the semiconductor substrate 105 by using MACE, so as to be connected to the buried conductive lines, and then the buried conductive layer 156 may be formed. Therefore, according to the above-described method and substrate processing systems 200, 200*a*, and 200*b* for forming the semiconductor device 100, when the semiconductor device 100 is manufactured, plasma damage may be suppressed and a manufacturing cost may be reduced.

Based on the above-described method and substrate processing system for forming a semiconductor device, according to some embodiments of the present invention, a process cost may be lowered and substrate damage may be reduced. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of forming a semiconductor device, the method comprising:

pretreating a semiconductor substrate comprising at least one buried power rail for power transmission, based on a chemical reaction by supplying a pretreatment gas for surface treatment onto a backside of the semiconductor substrate;

forming at least one metal catalyst layer on the backside of the semiconductor substrate so as to be at least partially aligned with the at least one buried power rail; and forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using metal assisted chemical etching (MACE), wherein the etching of the semiconductor substrate between the at least one metal catalyst layer and the at least one buried power rail is stopped by a liner insulating layer.

2. The method of claim 1, wherein the pretreatment gas comprises carbonyl sulfide (COS) gas for removing a natural oxide layer on the backside of the semiconductor substrate, and wherein the pretreating uses non-plasma thermal activation to prevent plasma damage to the semiconductor substrate.

3. The method of claim 1, wherein the pretreatment gas comprises radicals activated in a remote plasma generator to remove a natural oxide layer on the backside of the semiconductor substrate.

4. The method of claim 1, wherein the pretreating comprises:

removing a natural oxide layer on the backside of the semiconductor substrate; and modifying the backside of the semiconductor substrate to have hydrophilic termination.

5. The method of claim 4, wherein the removing of the natural oxide layer is performed by providing carbonyl sulfide (COS) gas onto the backside of the semiconductor substrate, and wherein the modifying of the backside of the semiconductor substrate is performed by supplying hydrogen gas onto the backside of the semiconductor substrate.

6. The method of claim 1, wherein the pretreating and the forming of the at least one metal catalyst layer are performed in situ in one process chamber or different process chambers of one metal deposition module while maintaining a vacuum atmosphere.

7. The method of claim 1, wherein at least a top surface and side walls of the at least one buried power rail are surrounded by the liner insulating layer when viewed from the backside of the semiconductor substrate, and wherein, in the forming of the at least one backside via hole, the etching of the semiconductor substrate is stopped when the at least one metal catalyst layer is at least partially in contact with the liner insulating layer.

8. The method of claim 1, wherein a diameter or a width of the at least one metal catalyst layer is less than or equal to a width of the at least one buried power rail, and wherein the at least one metal catalyst layer is vertically aligned with and spaced apart from the at least one buried power rail or vertically spaced apart from the at least one buried power rail within the width of the at least one buried power rail when viewed from a cross-section of the semiconductor substrate.

9. The method of claim 1, further comprising forming, on the backside of the semiconductor substrate, a passivation insulating layer having an opening at least partially aligned with the at least one buried power rail, wherein the at least one metal catalyst layer is formed in the opening of the passivation insulating layer.

10. The method of claim 9, wherein the forming of the passivation insulating layer comprises:

forming a photoresist layer on the passivation insulating layer to expose the opening; and forming the opening by etching the passivation insulating layer by using the photoresist layer as an etch mask, and wherein the forming of the at least one metal catalyst layer comprises:

forming a metal catalyst layer on the passivation insulating layer on which the photoresist layer remains; and forming the at least one metal catalyst layer remaining in the opening, by removing a portion of the metal catalyst layer on the photoresist layer by using a lift-off method.

11. The method of claim 1, further comprising:

removing the at least one metal catalyst layer descended to a bottom surface of the at least one backside via hole;

forming a liner dielectric layer on at least a side wall of the at least one backside via hole; and forming a buried conductive layer to bury the at least one backside via hole.

12. The method of claim 11, further comprising exposing the at least one buried power rail by removing at least a portion of the liner dielectric layer on the at least one buried power rail exposed by the at least one backside via hole after the at least one metal catalyst layer is removed.

13. The method of claim 11, wherein the forming of the liner dielectric layer comprises:

forming the liner dielectric layer on an inner surface of the at least one backside via hole; and partially removing the liner dielectric layer on the bottom surface of the at least one backside via hole to leave the liner dielectric layer on the side wall of the at least one backside via hole.

14. The method of claim 13, further comprising forming a diffusion barrier layer on the inner surface of the at least one backside via hole from which the liner dielectric layer is partially removed, so as to be connected to the at least one buried power rail, wherein the buried conductive layer is formed in the at least one backside via hole so as to be connected to the diffusion barrier layer.

15. The method of claim 11, wherein the at least one buried power rail, the at least one metal catalyst layer, and the buried conductive layer comprise the same metal.

16. A method of forming a semiconductor device, the method comprising:

pretreating a semiconductor substrate comprising at least one buried power rail for power transmission, based on chemical reaction by supplying a pretreatment gas for surface treatment onto a backside of the semiconductor substrate;

forming at least one metal catalyst layer on the backside of the semiconductor substrate so as to be at least partially aligned with the at least one buried power rail;

forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using metal assisted chemical etching (MACE) and to stop the etching of the semiconductor substrate when a liner insulating layer on the at least one buried power rail is at least partially exposed;

removing the at least one metal catalyst layer descended to a bottom surface of the at least one backside via hole;

removing at least a portion of the liner insulating layer on the at least one buried power rail exposed by the at least one backside via hole;

forming a liner dielectric layer on at least a side wall of the at least one backside via hole;

forming a diffusion barrier layer on an inner surface of the at least one backside via hole from which the liner dielectric layer is partially removed, so as to be connected to the at least one buried power rail; and forming a buried conductive layer to bury the at least one backside via hole.

17. The method of claim 16, wherein the pretreating comprises removing a natural oxide layer on the backside of the semiconductor substrate, and modifying the backside of the semiconductor substrate to have hydrophilic termination, wherein the removing of the natural oxide layer is performed by providing carbonyl sulfide (COS) gas onto the backside of the semiconductor substrate, wherein the modifying of the backside of the semiconductor substrate is performed by supplying hydrogen gas onto the backside of the semiconductor substrate, and wherein the pretreating and the forming of the at least one metal catalyst layer are performed in situ in one process chamber or different process chambers of one metal deposition module while maintaining a vacuum atmosphere.

18. A method of forming a semiconductor device, the method comprising:

pretreating a semiconductor substrate comprising at least one buried power rail for power transmission, based on a chemical reaction by supplying a pretreatment gas for surface treatment onto a backside of the semiconductor substrate;

forming, on the backside of the semiconductor substrate, a passivation insulating layer having an opening at least partially aligned with the at least one buried power rail;

forming at least one metal catalyst layer on the backside of the semiconductor substrate in the opening of the passivation insulating layer so that the at least one metal catalyst layer is at least partially aligned with the at least one buried power rail; and forming at least one backside via hole by supplying an etchant to the semiconductor substrate to anisotropically etch the semiconductor substrate between the at least one metal catalyst layer and the at least one buried power rail while the at least one metal catalyst layer is descending into the semiconductor substrate by using metal assisted chemical etching (MACE).

* * * * *